(12) United States Patent
Park et al.

(10) Patent No.: US 7,709,952 B2
(45) Date of Patent: May 4, 2010

(54) LIGHT EMITTING DIODE PACKAGE

(75) Inventors: Jin Woo Park, Kyungki-do (KR); Young Bok Yoon, Kyungki-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 42 days.

(21) Appl. No.: 11/643,694

(22) Filed: Dec. 22, 2006

(65) Prior Publication Data

US 2007/0145399 A1    Jun. 28, 2007

(30) Foreign Application Priority Data

Dec. 24, 2005    (KR)    ................. 10-2005-0129197

(51) Int. Cl.
*H01L 23/34*    (2006.01)
(52) U.S. Cl. .............. 257/717; 257/79; 257/99; 257/100; 257/E33.075; 257/E23.101
(58) Field of Classification Search .......... 257/99, 257/712, 720, 79, 98, 100, 706, 717, E33.075, 257/E23.08, E23.101
See application file for complete search history.

(56) References Cited

U.S. PATENT DOCUMENTS

| | | | | |
|---|---|---|---|---|
| 5,293,509 A | * | 3/1994 | Yamakawa et al. | 257/705 |
| 5,299,214 A | * | 3/1994 | Nakamura et al. | 372/36 |
| 5,455,738 A | * | 10/1995 | Montesano et al. | 361/707 |
| 6,864,513 B2 | * | 3/2005 | Lin et al. | 257/99 |
| 6,870,736 B2 | | 3/2005 | Lee et al. | |
| 6,936,855 B1 | * | 8/2005 | Harrah | 257/88 |
| 6,995,402 B2 | * | 2/2006 | Ludowise et al. | 257/91 |
| 7,284,882 B2 | * | 10/2007 | Burkholder | 362/294 |
| 7,329,942 B2 | * | 2/2008 | Tsou et al. | 257/594 |
| 2003/0189830 A1 | * | 10/2003 | Sugimoto et al. | 362/294 |
| 2004/0070070 A1 | * | 4/2004 | Sung | 257/706 |
| 2005/0242362 A1 | * | 11/2005 | Shimizu et al. | 257/99 |

* cited by examiner

*Primary Examiner*—Davienne Monbleau
*Assistant Examiner*—Eduardo A Rodela
(74) *Attorney, Agent, or Firm*—McDermott Will & Emery LLP

(57) ABSTRACT

An LED package is improved in heat radiating performance. The LED package includes a package substrate having heat radiating means; a heat radiating layer arranged on the package substrate with an area at least larger than a mounting area of a light emitting diode chip to provide a horizontal heat radiating path; and an electrically-connecting structure including first and second conductive leads arranged on the heat radiating layer. The light emitting diode chip is mounted on the heat radiating layer or the first conductive lead by a heat conductive adhesive layer.

15 Claims, 4 Drawing Sheets

(a)

(b)

LIGHT EMITTING DIODE PACKAGE

CLAIM OF PRIORITY

This application claims the benefit of Korean Patent Application No. 2005-129197 filed on Dec. 24, 2005, in the Korean Intellectual Property Office, the disclosure of which is incorporated herein by reference.

BACKGROUND OF THE INVENTION

1. Field of the Invention

The present invention relates to an LED package, more particularly, which can more efficiently radiate heat generated from an LED chip.

2. Description of the Related Art

In general, a Light Emitting Diode (LED) package is required to have high light efficiency together with excellent heat radiating characteristics. In particular, since a high power LED package used in the lighting industry generates a large amount heat, its heat radiating performance is a critical factor to maintain the reliability of a device.

In view of such heat radiating characteristics, conventional LED packages incorporate a heat sink of high heat conductivity installed in a package substrate. As another approach, it is also considered to make a package substrate itself from a high heat conductivity material. Conventional LED package structures are shown in FIGS. 1(a) and 1(b).

Referring to FIG. 1(a), a conventional LED package 10 includes a package substrate 11 with an LED chip 15 mounted thereon by an adhesive layer 14. The package substrate 11 has a heat sink 11a acting as heat radiating (or conducting) means, extending in a thickness direction from a mounting area where the chip 15 is arranged. An upper substrate 12 arranged on the package substrate 11 has a cavity surrounding the mounting area. First and Second electrodes (not shown) of the LED chip 15 are connected, respectively, to first and second conductive leads 16a and 16b arranged on the package substrate 11.

In the LED package 10 shown in FIG. 1(a), heat generated from the LED chip 15 can be transferred to the heat sink 11a. In this case, as indicated by arrow C, the heat transfer path is limited to a vertical direction along the heat sink formed in the thickness direction.

Referring to FIG. 1(b), a conventional LED package 20 includes a package substrate 21 with an LED chip 25 mounted thereon by an adhesive layer 24. An upper substrate 22 arranged on the package substrate 21 has a cavity surrounding a chip-mounting area. First and second electrodes (not shown) of the LED chip 25 are connected, respectively, to first and second conductive leads 26a and 26b arranged on the package substrate 21.

The package substrate 21 is a semiconductor substrate such as a ceramic substrate or Si substrate which has high heat conductivity. Thus the package substrate 21 itself can act as a heat sink or heat radiating means. However, even though the package substrate itself acts as the heat sink, heat is transferred radially from a contact surface of the LED chip, that is, a heat source. Accordingly, most heat is transferred vertically along a path indicated by arrow C1 but little heat is transferred laterally.

As shown in FIG. 1(a) and 1(b), in a convention LED package, heat generated from an LED chip is transferred substantially vertically through a bonding area of the LED chip with a heat sink or a heat sink substrate. As a result, although the heat sink or heat sink substrate is larger than the area of the LED chip, most heat is transferred along a path formed in a thickness direction of the substrate.

Accordingly, in the convention LED packages, even though a large sized heat sink or a heat sink substrate is used, the area functioning as a heat transfer path is limited and thus excellent heat radiating performance is rarely expectable.

SUMMARY OF THE INVENTION

The present invention has been made to solve the foregoing problems of the prior art and it is therefore an object of certain embodiments of the present invention to provide a novel structure of LED package which has an additional heat transfer path along an upper surface of a substrate in order to radiate heat not only in a thickness direction but also in a lateral direction of the substrate, thereby improving heat radiating performance.

According to an aspect of the invention for realizing the object, the invention provides an LED package. The LED package includes a package substrate having heat radiating means; a heat radiating layer arranged on the package substrate with an area at least larger than a mounting area of a LED chip to provide a horizontal heat radiating path; and an electrically-connecting structure including first and second conductive leads arranged on the heat radiating layer. Here, the LED chip mounted on the heat radiating layer or the first conductive lead by a heat conductive adhesive layer.

Preferably, the heat radiating layer is provided on substantially all upper surface area of the package substrate.

According to an embodiment of the invention, the heat radiating layer may comprise an electrically conductive material, and includes a first heat radiating area where the first conductive lead may be provided and a second heat radiating area where the second conductive lead is provided.

In this case, the LED chip may include first and second electrodes on an upper surface thereof, and be placed in divided areas to be arranged on both of the first and second heat radiating areas, wherein the first and second electrodes of the LED chip are connected to the first and second conductive leads by wires, respectively.

Alternatively, the LED chip may include first and second electrodes on lower and upper surfaces thereof, respectively, and be arranged on the first conductive lead in the first heat radiating area so that the first electrode is connected to the first conductive lead, wherein the second electrode of the LED is connected to the second conductive lead by a wire, and the heat conductive adhesive layer is electrically conductive to electrically connect the first electrode on the lower surface of the LED chip to the first conductive lead.

Preferably, the LED package may further include an upper substrate arranged on the package substrate, the upper substrate having a cavity surrounding the mounting area of the LED chip.

In particular, a reflecting layer may be arranged on an inside wall of the cavity and connected to the heat radiating layer. In this case, the reflecting layer may be connected to the heat radiating layer to improve heat radiating effect through another structure such as a metallic-reflecting layer.

According to another embodiment of the invention, the heat radiating layer may comprise an electrically conductive material, and be electrically insulated from the first and second conductive leads by an insulating layer interposed between the heat radiating layer and the conductive leads.

In this case, the LED chip may include first and second electrodes on an upper surface thereof, and be arranged to be in direct contact with the heat radiating layer, wherein the first and second electrodes of the LED are electrically connected to the first and second conductive leads by wires, respectively.

Alternatively, the LED chip may include first and second electrodes on lower and upper surfaces thereof, respectively, and be arranged on the first conductive lead so that the first conductive lead is connected to the first electrode, wherein the second electrode of the LED chip is connected to the second conductive wire by a wire, and the heat conductive adhesive layer comprises an electrically-conductive material.

Preferably, the heat radiating means of the package substrate may be extended in a thickness direction of the package substrate from an area of an upper surface of the package substrate corresponding to the mounting area of the light emitting chip. As an alternative, the package substrate may comprise one selected from a group consisting of a Si substrate, a ceramic substrate and a metal substrate, and be heat conductive to act as the heat radiating means by itself.

Preferably, the heat radiating layer may have a heat conductivity higher than that of the heat radiating means in order to further enhance heat radiating performance in a horizontal direction. Preferably, the heat radiating means may have a heat conductivity of at least 100 W/mK, and the heat radiating layer has a heat conductivity of at least 500 W/mK.

More particularly, the heat radiating layer may comprise one selected from a group consisting of a diamond film, a metal film and a ceramic film. Alternatively, the heat radiating layer may comprise a composite material containing a matrix and a heat conductive filler of a high heat conductivity, wherein the matrix is selected from a group consisting of a polymer matrix, a metal matrix and a ceramic matrix. Preferably, the heat conductive filler may comprise a high electrically-conductive carbon material such as carbon nano tube.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The present invention will now be described more fully hereinafter with reference to the accompanying drawings, in which preferred embodiments of the invention are shown.

Figure 1:
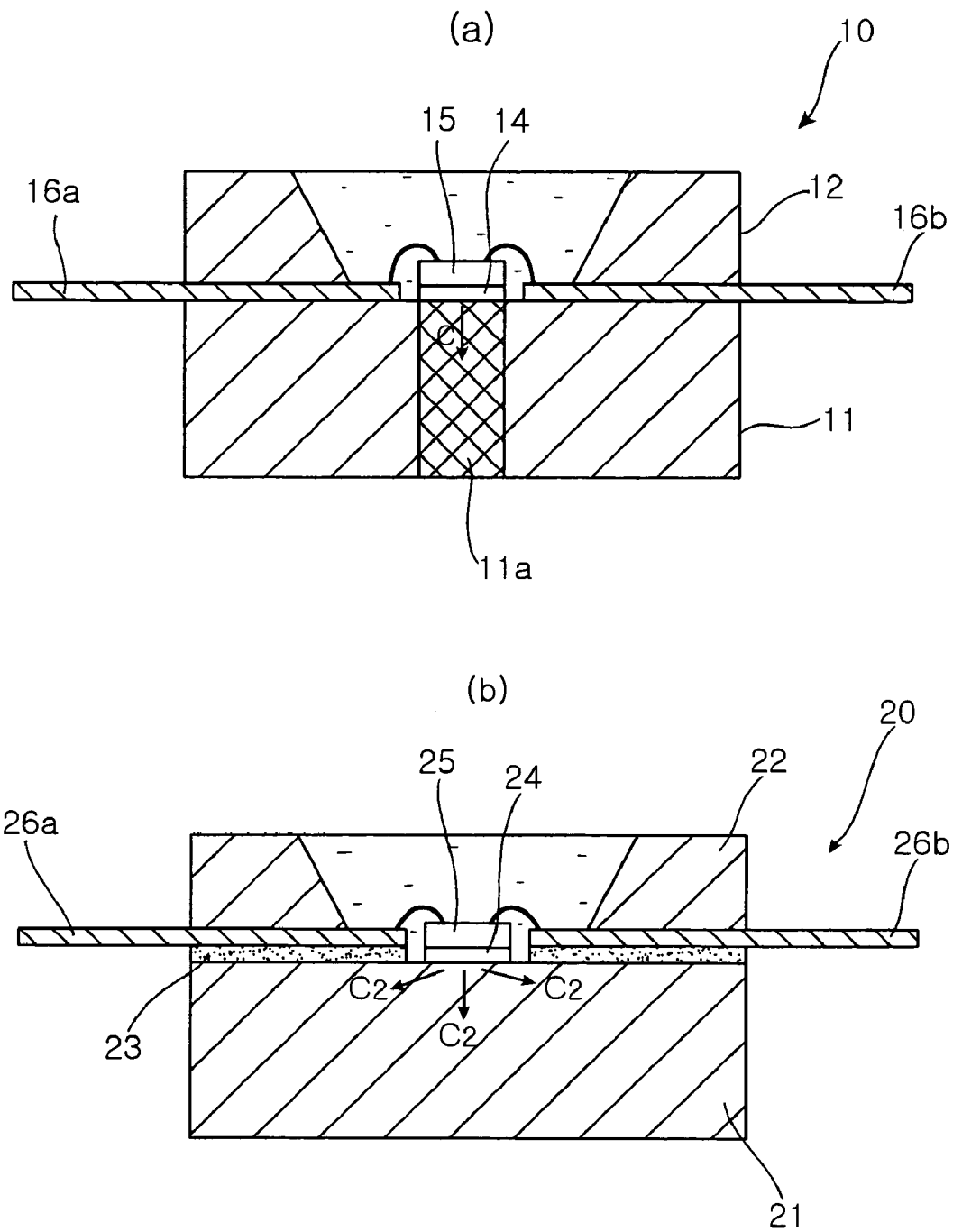
FIG. 1(a) and 1(b) are side cross-sectional view each illustrating a conventional LED package.
Figure 2:
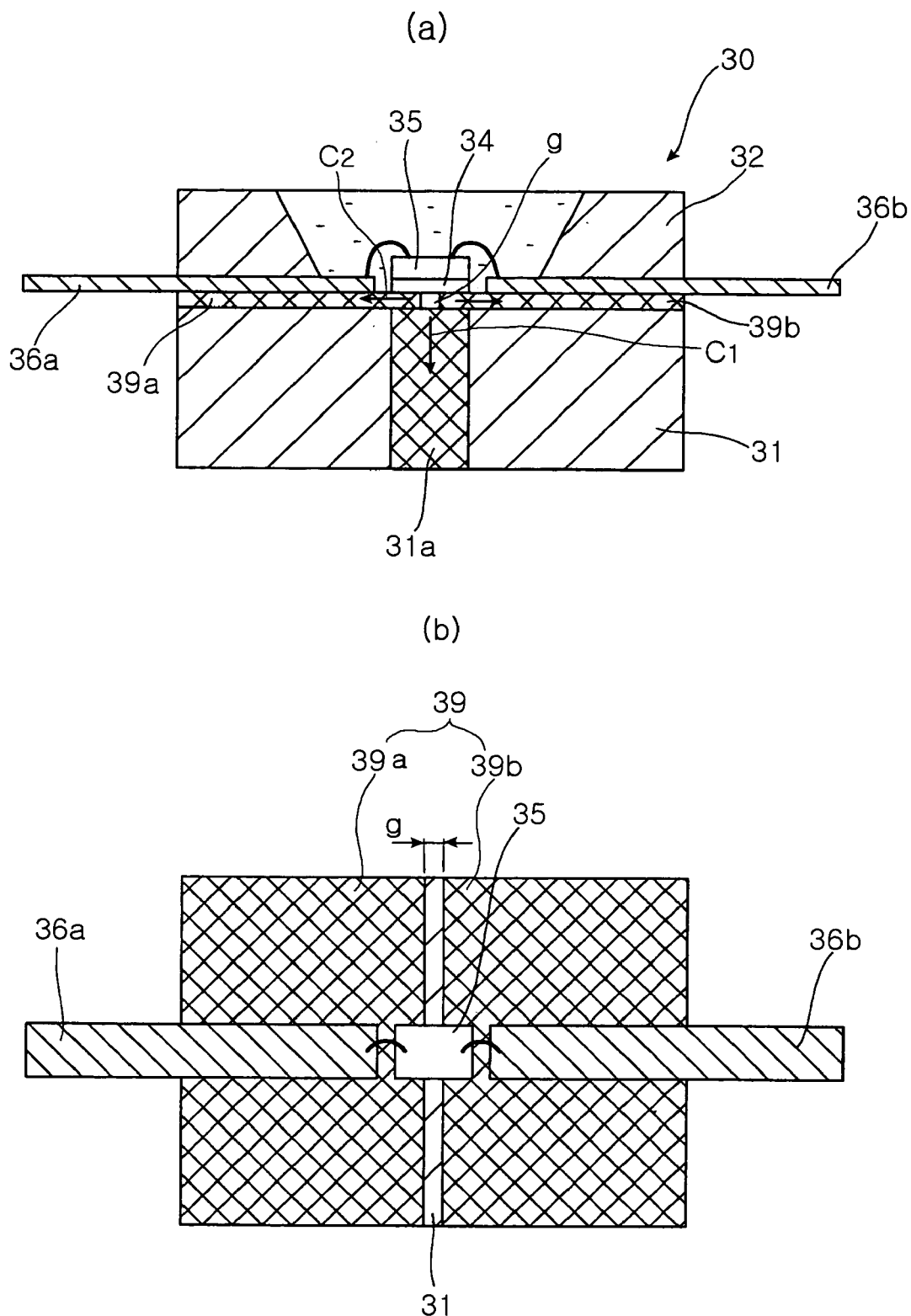
FIG. 2 illustrates an LED package according to an embodiment of the invention, in which (a) is a side cross-sectional view thereof, and (b) is a top view thereof.

FIG. 2 illustrates an LED package 30 according to an embodiment of the invention, in which (a) is a side cross-sectional view thereof, and (b) is a top view thereof. Here, FIG. 2(b) can be understood as a plan view of the LED package 30 shown in FIG. 2(a).

Referring to FIG. 2(a) first, the LED package 30 of this embodiment includes a package substrate 31 with an LED chip 35 mounted thereon and an upper substrate 32 arranged on the package substrate 31. The upper substrate 32 has a cavity surrounding a chip-mounting area. The package substrate 31 has a heat sink 31a acting as heat radiating (or conducting) means, extending from the chip-mounting area in a thickness direction. Although not shown in the drawings, a reflecting layer may also be provided on the inside wall of the upper substrate defined by the cavity.

A heat radiating layer 39 is arranged on the upper surface of the package substrate 31. While this embodiment has illustrated a configuration of the heat radiating layer 39 formed on substantially the entire area of the package substrate in order to maximize a heat radiating path, it is not intended to be limiting. Rather, the heat radiation layer 39 may be formed at least larger than the chip-mounting area to expand the heat radiating path in a horizontal or lateral direction of the package. While the conventional heat sink 31a provides a heat radiating path C1 in a vertical direction, the heat radiating layer 39 adopted in this embodiment serves as means for enhancing a heat radiating path C2 in a lateral or horizontal direction and thereby improving overall heat radiating performance.

In general, since a heat transfer path is made radially of the heat source and the bonding surface, the heat radiating layer 39 preferably has a heat conductivity higher than that of the material adopted for the heat sink in order to further enhance heat transfer tendency in a horizontal direction. Preferably, heat radiating means such as the heat sink 31a have a heat conductivity of 100 W/mK or more, and the heat radiating layer has a higher heat conductivity of 500 W/mK or more.

As a detailed example, the heat radiating layer 39 may be made of metal or ceramic. More preferably, the heat radiating layer 39 may be made of a composite material composed of a matrix selected from the group consisting of a polymer matrix, a metal matrix and ceramic matrix and a heat conductive filler of high heat conductivity contained in the matrix. The heat conductive filler may preferably be made of a carbon material of high heat conductivity such as carbon nano tube. A carbon nano tube matrix is expectable to have a high heat conductivity on the order of 1000 W/mK and thus can improve heat radiation performance in a lateral or horizontal direction remarkably.

The heat radiation layers 39a and 39b may be of sheets which are prepared separately from the package substrate and attached to the upper surface thereof. Alternatively, the heat radiation layers may be formed via paste application, film deposition and the like.

In this embodiment, the heat radiating layer as in FIG. 2(b) is divided into first and second heat radiating areas 39a and 39b by a separating gap g to be electrically separated from each other. The LED chip 35 may be arranged on one heat radiating area but preferably arranged on the gap g while contacting both of the first and second heat radiating areas 39a and 39b in order to diversify horizontal or lateral heat transfer paths thereby further enhancing heat radiating performance.

While this embodiment has been illustrated with reference to a lateral structure with first and second electrodes arranged on the upper surface of the LED chip 35, it is not intended to be limiting. Rather, it can be applied similarly to a vertical LED chip with a first electrode arranged on the upper surface of the LED chip and a second electrode arranged on the underside surface of the LED chip. In this case, during a chip-mounting process, the first electrode can be electrically connected to the first conductive lead by the adhesive layer 34 having electric conductivity. The conductive adhesive layer 34 may be made of conductive epoxy or solders of various metals and alloys thereof. The process of connecting the electrodes to the vertical LED structure can be adopted similarly by other embodiments.

In addition, first and second electrodes (not shown) of the LED chip 35 are connected, respectively, to the first and second conductive leads 36a and 36b on the package substrate 31. In this embodiment, the conductive leads were illustrated as an electrically-connecting structure. However, various electrically-connecting structures can be realized by adopting conductive vias extending through a substrate as shown in FIG. 4(a).

Figure 3:
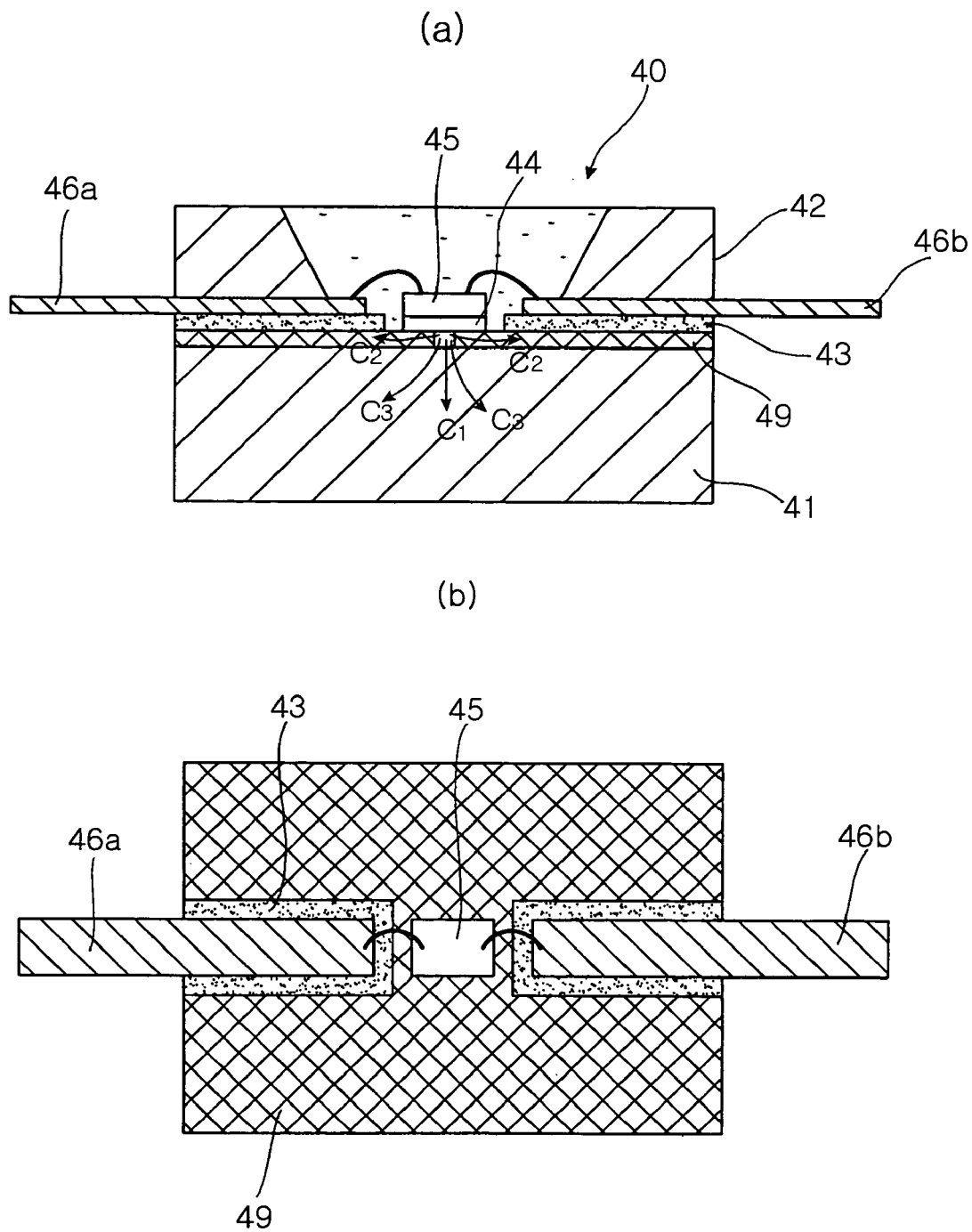
FIG. 3 illustrates an LED package according to another embodiment of the invention, in which (a) is a side cross-sectional view thereof, and (b) is a top view thereof.

FIG. 3 illustrates an LED package 40 according to another embodiment of the invention, in which (a) is a side cross-sectional view thereof, and (b) is a top view thereof.

Referring to FIG. 3(a), the LED package 40 of this embodiment includes a package substrate 41 with an LED chip 45 mounted thereon and an upper substrate 42 arranged on the package substrate 41. The upper substrate 42 has a cavity surrounding a chip-mounting area.

The package substrate 41 of this embodiment is not provided with a separate heat sink (see 31a of FIG. 2(a)). In this embodiment, however, the package substrate 41 is made of a relatively high heat conductivity material to act as a heat sink or heat radiating means by itself. For example, the package substrate may be composed of a Si substrate, a ceramic substrate or a metal substrate. The heat sink substrate 41 does not have electric conductivity, but an impurity-doped Si substrate and a metal substrate have electric conductivity.

In a case where the heat sink substrate 41 is electrically conductive as in this embodiment, even if the heat radiating layer is separated by a gap into two areas, which are connected respectively to two leads of different polarities as in the former embodiment, the leads are electrically connected with each other by the substrate 41 underlying the heat conducting layer 49 and thus a suitable electrically-connecting structure is not provided. As an approach to solve this problem, this embodiment adopts an insulating layer 43 that is formed at least in those areas corresponding to the conductive leads 46a and 46b so that the conductive leads 46a and 46b are electrically separated from the heat conducting layer 49.

In this embodiment, as the heat sink substrate 41 is combined with the heat radiating layer 49, the heat transfer path can be further diversified than that shown in FIG. 2(a). That is, heat transfer paths C1 and C2 are efficiently ensured in vertical and lateral directions. Furthermore, as the heat radiating layer 49 of a high heat conductivity also enables a heat sink area located outside the chip mounting area to act as a heat radiating part, an additional heat transfer path C3 can be provided across a wide area.

Figure 4:
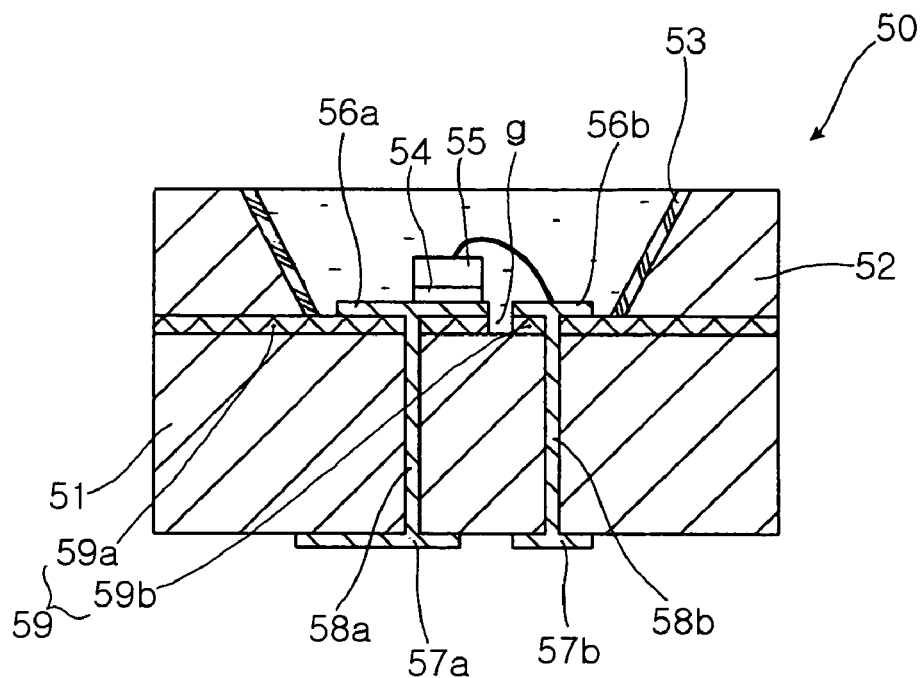
FIG. 4 illustrates an LED package according to further another embodiment of the invention, in which (a) is a side cross-sectional view thereof, and (b) is a top view thereof.
Figure 4:
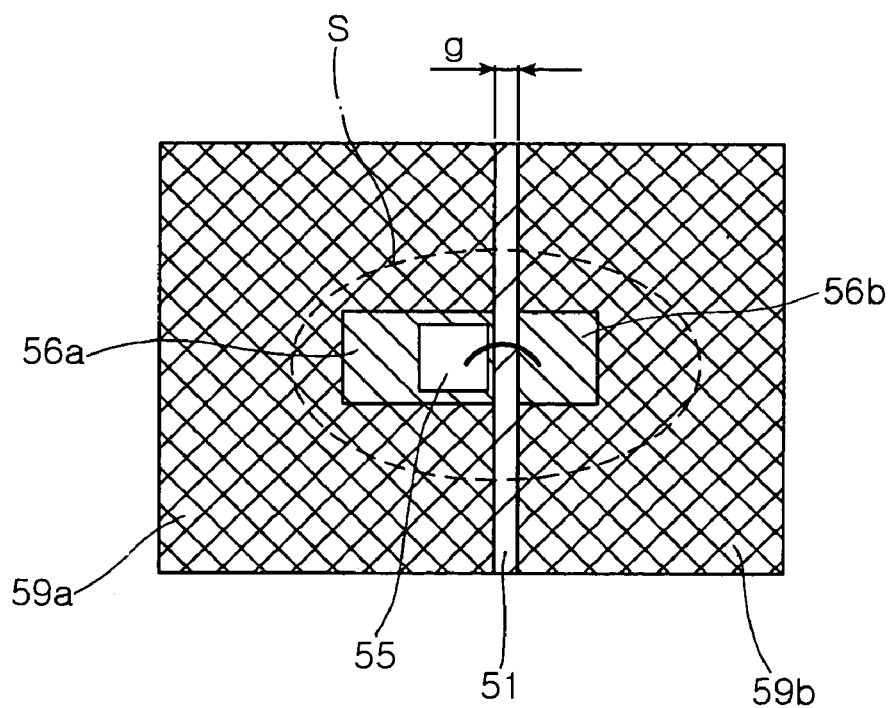

FIG. 4 illustrates an LED package 50 according to further another embodiment of the invention, in which (a) is a side cross-sectional view thereof, and (b) is a top view thereof.

Referring to FIG. 4(a), the LED package 50 of this embodiment includes a package substrate 51 with an LED chip 55 mounted thereon and an upper substrate 52 arranged on the package substrate 51. The upper substrate 52 has a cavity surrounding a mounting area of the chip 51. While the package substrate 51 is provided as a heat sink substrate as shown in FIG. 4(a), it may be particularly a ceramic substrate or a semiconductor substrate of a high electric insulating property in this embodiment.

A heat radiating layer 59 is formed on the upper surface of the package substrate 51, and in this embodiment, divided into first and second heat radiating areas 59a and 59b by a gap g to be electrically separated from each other. In this embodiment, the heat radiating layer 59 is formed on substantially the entire area of the package substrate in order to maximize the heat radiating path. As described above, the heat radiating layer 59 enhances the lateral heat radiating path in such a fashion that heat can radiate to the upper substrate with the cavity, thereby raising overall heat radiating performance.

This embodiment also provides first and second electrically-connecting structures. The first electrically-connecting structure includes a first contact pad 56a formed on the upper surface of the heat radiating layer 59, a first external terminal 57a and a first conductive via 58a connecting the first contact pad 56a with the first external terminal 57a. Likewise, the second electrically-connecting structure includes a second contact pad 56b formed on the upper surface of the heat radiating layer 59, a second external terminal 57b and a second conductive via 58b connecting the first contact pad 56b with the first external terminal 57b.

The LED chip adopted in this embodiment is of a vertical structure with first and second electrodes (not shown) formed on lower and upper surfaces thereof, respectively. When the chip is mounted, the first electrode formed on the lower surface can be connected to the first conductive lead extended by an electrically conductive adhesive layer 54. Also in the package structure of this embodiment, in a case that a vertical structure as in FIG. 2(a) is adopted, the LED chip may be arranged on the separating gap g to contact both of the first and second heat radiating areas 55a and 55b.

According to the foregoing disclosure as set forth above, a heat radiating layer for making a lateral or horizontal heat transfer path is arranged on a package substrate having heat radiating means so as to remarkably improve heat radiating performance. In particular, in a package structure having a package substrate acting as a heat sink by itself combined with a heat radiating layer of a high heat conductivity, more area of the package structure can act as a substantial heat sink. Accordingly, the present invention can provide an LED package having high heat radiating performance.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

What is claimed is:

1. A light emitting diode package comprising:
    a package substrate having heat radiating means;
    an upper substrate arranged on the package substrate, the upper substrate having a cavity surrounding a mounting area of a light emitting diode chip;
    a heat radiating layer arranged on the package substrate with an area at least larger than the mounting area of the light emitting diode chip to provide a horizontal heat radiating path, the heat radiating layer having a side exposed to the outside of the package, the exposed side being located between the package substrate and the upper substrate;
    an electrically-connecting structure including first and second conductive leads arranged on the heat radiating layer; and
    the light emitting diode chip mounted on the heat radiating layer or the first conductive lead by a heat conductive adhesive layer;
    wherein the heat radiating layer has a heat conductivity higher than that of the heat radiating means; and
    the heat radiating layer comprises an electrically conductive material, and is electrically insulated from the first and second conductive leads by an insulating layer interposed between the heat radiating layer and the conductive leads.

2. The light emitting diode package according to claim 1, wherein the heat radiating layer is provided on substantially all upper surface area of the package substrate.

3. The light emitting diode package according to claim 1, wherein the heat radiating layer comprises an electrically conductive material, and includes a first heat radiating area where the first conductive lead is provided and a second heat radiating area where the second conductive lead is provided.

4. The light emitting diode package according to claim 3, wherein the light emitting diode chip includes first and second electrodes on an upper surface thereon and is placed in divided areas to be arranged on both of the first and second heat radiating areas, and wherein the first and second electrodes of the light emitting diode chip are connected to the first and second conductive leads by wires, respectively.

5. The light emitting diode package according to claim 3, wherein the light emitting diode chip includes first and second electrodes on lower and upper surfaces thereof, respectively, and is arranged on the first conductive lead in the first heat radiating area so that the first electrode is connected to the first conductive lead, and wherein the second electrode of the light emitting diode is connected to the second conductive lead by a wire, and the heat conductive adhesive layer is electrically conductive.

6. The light emitting diode package according to claim 5, further comprising a reflecting layer arranged on an inside wall of the cavity and connected to the heat radiating layer.

7. The light emitting diode package according to claim 1, further comprising a reflecting layer arranged on an inside wall of the cavity and connected to the heat radiating layer.

8. The light emitting diode package according to claim 1, wherein the light emitting diode chip includes first and second electrodes on an upper surface thereof, and is arranged to be in direct contact with the heat radiating layer, and wherein the first and second electrodes of the light emitting diode are electrically connected to the first and second conductive leads by wires, respectively.

9. The light emitting diode package according to claim 1, wherein the light emitting diode chip includes first and second electrodes on lower and upper surfaces thereof, respectively, and is arranged on the first conductive lead so that the first conductive lead is connected to the first electrode, and wherein the second electrode of the light emitting diode chip is connected to the second conductive wire by a wire, and the heat conductive adhesive layer comprises an electrically-conductive material.

10. The light emitting diode package according to claim 1, wherein the heat radiating means of the package substrate is extended in a thickness direction of the package substrate from an area of an upper surface of the package substrate corresponding to the mounting area of the light emitting chip.

11. The light emitting diode package according to claim 1, wherein the package substrate comprises one selected from a group consisting of a Si substrate, a ceramic substrate and a metal substrate, and is heat conductive to act as the heat radiating means by itself.

12. The light emitting diode package according to claim 1, wherein the heat radiating means have a heat conductivity of at least 100 W/mK, and the heat radiating layer has a heat conductivity of at least 500 W/mK.

13. The light emitting diode package according to claim 1, wherein the heat radiating layer comprises one selected from a group consisting of a diamond film, a metal film and a ceramic film.

14. The light emitting diode package according to claim 1, wherein the heat radiating layer comprises a composite material containing a matrix and a heat conductive filler of a high heat conductivity, the matrix selected from a group consisting of a polymer matrix, a metal matrix and a ceramic matrix.

15. The light emitting diode package according to claim 14, wherein the heat conductive filler comprises a carbon material.

* * * * *